United States Patent [19]

Yabu et al.

[11] Patent Number: 5,042,919
[45] Date of Patent: Aug. 27, 1991

[54] EXTERNAL-CIRCUIT CONNECTING AND PACKAGING STRUCTURE

[75] Inventors: Shigeki Yabu, Machida; Hiroshi Takabayashi, Kawasaki, both of Japan

[73] Assignee: Canon Kabushiki Kaisha, Tokyo, Japan

[21] Appl. No.: 463,486

[22] Filed: Jan. 11, 1990

Related U.S. Application Data

[62] Division of Ser. No. 186,943, Apr. 27, 1988, abandoned.

[30] Foreign Application Priority Data

| May 1, 1987 | [JP] | Japan | 62-066674[U] |
| Jun. 12, 1987 | [JP] | Japan | 62-146379 |
| Jul. 2, 1987 | [JP] | Japan | 62-166417 |

[51] Int. Cl.$^5$ .......................... G02F 1/13; H01L 39/02
[52] U.S. Cl. ........................ 359/88; 357/80; 359/79
[58] Field of Search ............ 350/336, 332, 339 R, 350/334; 357/80, 84

[56] References Cited

U.S. PATENT DOCUMENTS

| 4,145,120 | 3/1979 | Kubota | 350/332 |
| 4,336,551 | 6/1982 | Fujita et al. | 357/80 |
| 4,386,293 | 5/1983 | Waldron | 350/336 X |
| 4,640,581 | 2/1987 | Nakanowatari et al. | 350/336 X |
| 4,767,189 | 8/1988 | Hayashi et al. | 350/334 |
| 4,826,297 | 5/1989 | Kubo et al. | 350/339 R |
| 4,842,373 | 6/1989 | Tomofuji et al. | 350/336 |
| 4,964,700 | 10/1990 | Takabayashi | 350/336 |

FOREIGN PATENT DOCUMENTS 52-69646  6/1977  Japan .................................. 350/336

Primary Examiner—Stanley D. Miller
Assistant Examiner—Huy K. Mai
Attorney, Agent, or Firm—Fitzpatrick, Cella, Harper & Scinto

[57] ABSTRACT

There is disclosed a method of connecting an external circuit, including the steps of disposing between an electrode for connecting the external circuit connected with an electrode for driving a liquid crystal panel and an external circuit electrode connected with the external circuit, a film comprising an insulating resin containing conductive particles dispersed therein, and applying a pulse voltage to a heat tool under the pressure-applied state.

7 Claims, 6 Drawing Sheets

EXTERNAL-CIRCUIT CONNECTING AND PACKAGING STRUCTURE

This application is a division of application Ser. No. 186,943, filed Apr. 27, 1988 now abandoned.

BACKGROUND OF THE INVENTION

1. Field of the Invention

The present invention relates to a method of connecting an external circuit of a liquid crystal panel, and more particularly to a connecting method suited for connecting an external circuit for a ferroelectric liquid crystal panel, and a packaging structure thereby formed.

2. Related Background Art

Hitherto a method has been developed for mutually connecting FPC (a flexible printed-circuit substrate) and wiring substrates (glass epoxy substrates, glass substrates, ceramic substrates, FPC, etc.) in which they are connected by thermocompression bonding of a film-shaped anisotropic conductive film comprising a conductive material incorporated by dispersion in an insulating resin. Particularly in recent years, in the field of image display units, such as liquid crystal display devices and EL display devices that can replace conventional CRT, or in the field of image reading units such as close contact image sensors of continuous length integrally formed using amorphous-Si or the like as sensors that can replace conventional CCD, the connecting method using the anisotropic conductive film having high-density resolution is widely used.

Also frequently used as FPC are film carrier tapes on which IC chips can be directly mounted. These film carrier tapes have a wiring function for making connection to image display devices or image reading devices and also have a function that enables achievement of rationale assembly processes.

However, in the display panels connected with external drive circuits according to a conventional connecting method, the resistance becomes so large that a large voltage is required for driving liquid crystal panels.

FIG. 9 illustrates a cross section of a conventional film carrier packaging structure 50, wherein a copper foil 53 constituting a conductive material pattern is bonded on a flexible insulating film 51 with the use of a bonding material. At the inside of a device hole 55 bored in the flexible insulating film 51, an inner lead-bonding area 56 is formed in the shape of a finger to make a connection with a semiconductor device 54, at which the semiconductor device is connected.

This film carrier 50 is joined by thermocompression bonding on a transparent conductive film 59 of ITO or the like, formed, for example, on a glass substrate of a liquid crystal display device, with the use of an anisotropic conductive film 57 comprising conductive particles such as metal particles dispersed in an adhesive.

However, the above conventional film carrier packaging structure has the problems discussed below.

(a) In recent years, liquid crystal display devices have come to be used as large screen displays replacing conventional CRTS, and liquid crystal displays of, for example, 640×400 dots or more have come to be used in personal computers and word processors. In addition, there are increasing demands for making screens larger, for increasing the degree of precision and for generating colored images.

In instances where driving ICs are connected to these large screen liquid crystal displays, a packaging structure packaged by the anisotropic conductive film by use of the film carrier system as mentioned above has recently come to be often used. Known anisotropic conductive film are, for example, CP-2132 (a resin composition comprising a styrene-butadiene copolymer and solder particles disposed therein) available from Sony Chemicals Corp., AC5052 (a resin composition comprising a styrene-butadiene copolymer and Au-plated resin particles disposed therein) available from Hitachi Chemical Co., Ltd., and these can have a connection resolution amounting to 5 lines/mm (200 μm pitch).

Now, in addition to the demands for making screens larger, increasing the degree of precision higher and generating colored images, there are also demands for increasing the density and narrowing the pitch of picture elements of the liquid crystal displays. In making screens larger, a delay in signals from the driving ICs may occur owing to an increase in load impedance of the transparent conductive film on the glass substrate of the liquid crystal display, resulting in a lowering of display quality levels. In order to prevent such a lowering of display quality levels, a system has been devised in which, as shown in FIG. 10, the patterns of the transparent conductive film 59 are drawn from the central part of a screen to both sides of the glass substrate 58, and the film carriers 50 for the driving ICs are connected to both sides thereof. There are also demands for making the pitches of picture elements narrower, for example, 8 lines/mm (125 μm pitch) or 10 lines/mm (100 μm pitch), in regard to making a degree of precision higher and generating colored images, but, as mentioned above, there is at the present time a limit of about 5 lines/mm (200 μm pitch) in packaging film carriers with the use of the anisotropic conductive films. Therefore, for example, as shown in FIG. 11, the patterns of the transparent conductive film 59 on the glass substrate 58 are alternately drawn to both sides of the glass substrate 58 in a zigzag fashion to reduce the pattern pitch to a half, and the film carriers 50 for driving ICs are connected to both sides thereof.

However, when it is attempted to package the driving ICs on both sides of the glass substrate 58, as mentioned above, the following problem occurs. Assume that, as shown in FIG. 12, the liquid crystal picture element driving output of a driving IC 71 to be packaged at one side (the left-hand side in the drawing) is designed to be scanned from 1 to the direction of an arrow as shown in the drawing. When an identical driving IC 71 is packaged at the other side (the right-hand side in the drawing) as shown in FIG. 13, the direction of the liquid crystal picture element driving output of the driving IC 71 becomes as shown in an arrow in the drawing, resulting in reversed scanning directions on both sides of the glass substrate 58 to make it impossible to use the same driving ICs. For this reason, it becomes necessary to design the driving ICs 71 so as to have an output capable of being scanned in both directions, or to use two type of quite different driving ICs (it follows that four types are required since in a liquid crystal display the driving ICs are required respectively for upper and lower two sheets of glass substrates), thus increasing the cost for the driving ICs and complicating the carrier-packaging processes.

The following problems also occur. If the above-described manner of packaging as shown in FIG. 9 is used, a high temperature of from 150° to 250° C. is applied to the flexible insulating film 51 of polyimide or the like formed by hot pressing for the thermocompression bonding when the anisotropic conductive film 57 is thermocompression bonded. For this reason the flexible insulating film 51 undergoes, owing to the difference in thermal expansion coefficient between the flexible insulating film 51 and glass substrate 58, thermal expansion at the time of the thermocompression bonding. As a result, film 51 shrinks after the thermocompression bonding. This causes slippage between the film 51 and the glass substrate 58. Such slippage is generated in the anisotropic conductive film 57 or a stress is applied thereto to bring about an increase in connection resistance and a lowering of connection strength, resulting in a lowering of reliability in the packaging of film carriers.

(c) Additionally, the following additionally problems also occur: At the time of the thermocompression bonding, it is actually desirable to apply heat to the anisotropic conductive film in the range of from 130° to 180° C. (variable depending on manufacturer's products) with the precision of about ±5° C. However, in the conventional packaging structure heating is carried out by means of a hot press for the thermocompression bonding through the flexible insulating film 51 of the film carrier 50. As a result, this flexible insulating film may work as an thermal insulating material, so that it is difficult to control the thermal energy to be applied to the anisotropic conductive film; also heating is carried out for a long time.

SUMMARY OF THE INVENTION

An object of the present invention is to provide a method of connecting a liquid crystal panel, that can overcome the above disadvantages, and set the resistance of the connecting area to a sufficiently low value.

Another object of the present invention is to eliminate the disadvantages in the above prior art, to make it possible to package film carriers for driving ICs on both sides of a substrate, and at the same time to provide a film carrier packaging structure that can prevent the reliability of connection from being lowered because of the slippage or stress caused by the difference in the thermal expansion coefficient between the flexible insulating film and the substrate to be connected thereto, to make it easy to control the heating temperature upon thermocompression-bonding, and to shorten the heating time.

According to one aspect the present invention relates to a method of connecting an external circuit, comprising disposing between an electrode for connecting the external circuit connected with an electrode for driving a liquid crystal panel and an external circuit electrode connected with the external circuit, a film comprising an insulating resin containing conductive particles dispersed therein, and applying a pulse voltage to a heat tool under a pressure-applied state.

The present invention also relates to a film carrier packaging structure comprising an outer lead-bonding area and inner lead-bonding area of a conductive material pattern formed on a flexible insulating film, wherein the outer lead-bonding area of a film carrier, extending from said flexible insulating film in the shape of a finger, is disposed so as to face a wiring substrate with the interposition an anisotropic conductive film, the outer lead-bonding area being thermocompression-bonded to the wiring substrate by heating through another flexible insulating film thinner than the first-mentioned flexible insulating film.

DETAILED DESCRIPTION OF PREFERRED EMBODIMENTS

The present invention will be described below with reference to the drawings.

Figure 1:
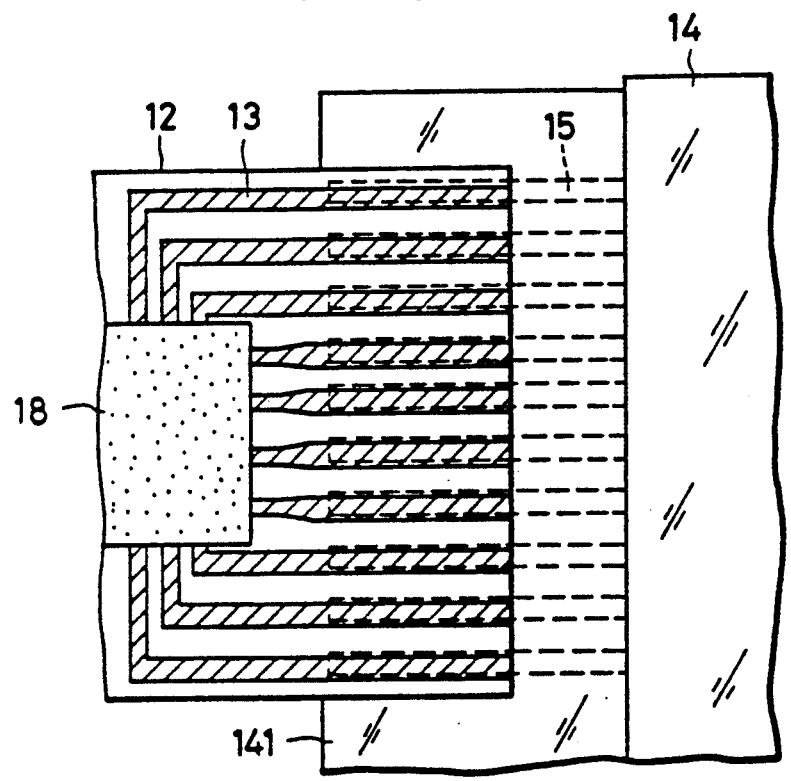
FIG. 1 is a plan view illustrating an embodiment in which the display panel and an external drive circuit have been electrically connected according to the connecting method of the present invention.
Figure 2:
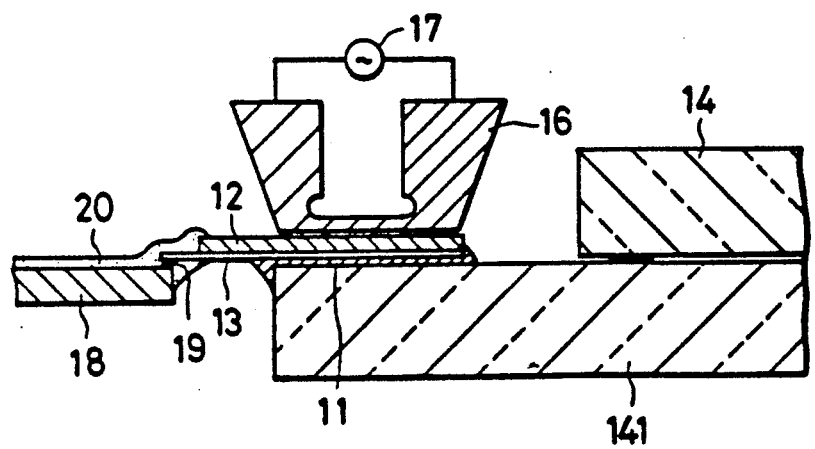
FIG. 2 is a cross section of a connecting unit used in practicing the connecting method of the present invention.

FIG. 1 is a plan view illustrating an embodiment in which a liquid crystal panel 14 and an external drive circuit IC 18 are electrically connected with each other according to the connecting method of the present invention, and FIG. 2 is a cross section of a connecting device used in the present invention. In the figures, the numeral 11 denotes an anisotropic conductive adhesive; 12, denotes a film carrier tape; 13, denotes an external circuit electrode; 14, denotes a liquid crystal panel; 141, denotes a substrate extended from the liquid crystal panel; 15, denotes an electrode for connecting the external circuit; 16, denotes a heat tool; 17, a heating electric source; 18, denotes an IC; 19, denotes a bonding member; and 20, denotes an adhesive.

In the present invention, the anisotropic conductive adhesive is provided between the external circuit electrode 13 of the film carrier tape 12 and the external circuit connecting electrode 15. The adhesive is pressed by means of the heat tool 16, followed by the application of a voltage to the heating electric source 17 of the heat tool 16 to effect thermocompression bonding. Thereafter application of the voltage of the heating electric source 17 is stopped and then the pressing by the heat tool 16 is released. To repeat the above operation, a pulse voltage is applied from the heating electric source 17 to the heat tool 16.

Figure 3:
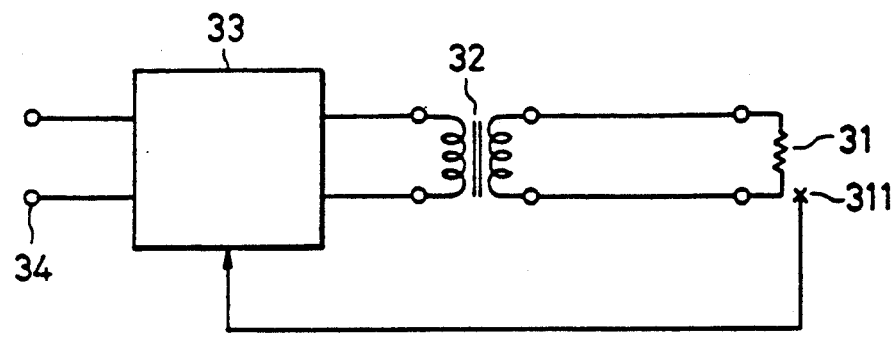
FIG. 3 is a circuit diagram of a pulse heat tool.

FIG. 3 is a circuit diagram of the heat tool 16, wherein the numeral 31 denotes a pulse heat tool; 311, denotes a thermoelectric couple; 32, denotes a trans; 33, denotes a trigger control system; and 34, denotes an AC electric source. In a preferred example of the present invention, the controlling of the trigger control system makes it possible to output to the heat tool 31 a voltage of pulse width of 4 msec and ±1 V with a frequency of 100 Hz.

Figure 4A:
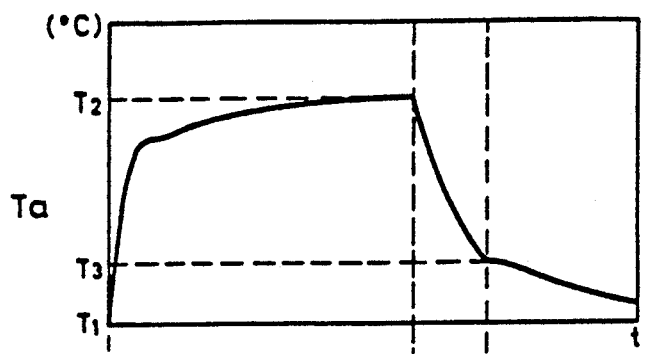
FIGS. 4A to 4D are explanatory views showing the characteristics of the present invention on time axes.
Figure 4B:
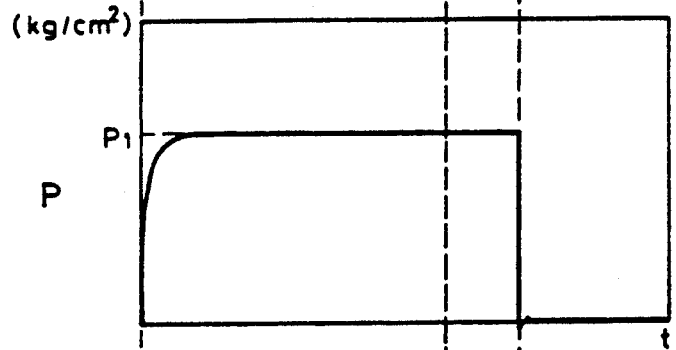
Figure 4C:
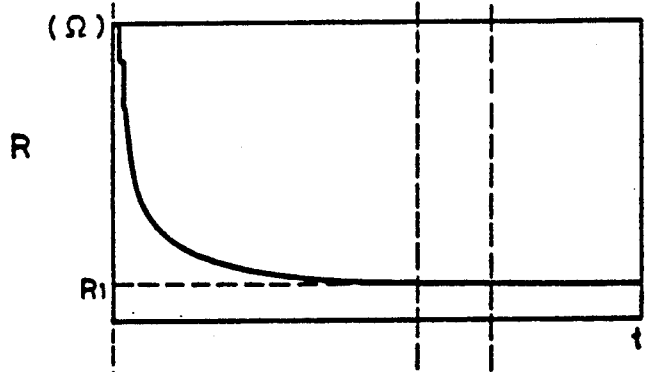

FIG. 4A shows the temperature (Ta) of the anisotropic conductive film 11 at the time of thermocompression bonding, and FIG. 4B shows the pressure loading (P). More specifically, once the pressing is started, heating is effected by means of the pulse heat tool to raise the temperature from room temperature (about 23° C.) to $T_2$ (about 130° C.). After $t_1$ (about 20 seconds), the application of voltage to the pulse heat tool 16 is stopped and air blowing is carried out, whereby the temperature is dropped to $T_3$ (about 60° C.) after $t_2$ (about 25 seconds), and the pressing by the pulse heat tool 16 is terminated at this point in time. The temperature $T_2$ is set at such a temperature that the anisotropic conductive film 11 can be sufficiently melted, and the temperature $T_3$ at such a temperature that a sufficient bond strength can be obtained. FIG. 4C shows the connection resistance value (R) observed at this time, and is seen to be kept stable both after termination of the heating and after termination of the pressing.

Figure 4D:
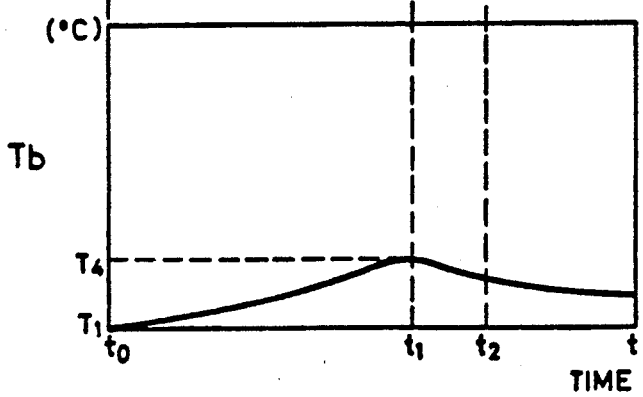

FIG. 4D shows data on the temperature (Tb) of a display area of a ferroelectric liquid crystal display device at a site nearest to the connecting area (5 mm distant), according to which $T_4$ was found to be 40° C.

The anisotropic conductive adhesive 11 used in the present invention comprises a film formed of a thermoplastic resin containing conductive particles dispersed therein, and can be formed into a cured material under given conditions for heat-curing. As the particles of conductive materials used here, there can be used particles having good conductivity, comprising particles of metals or alloys such as Ni, An, Ag and soft solder, or spherical resin particles coated with Au, Ni, etc. Also, usable as this spherical resin particles are those having a linear expansion coefficient substantially equal to that of curable resins. These conductive materials are contained in the proportion of from 0.5 to 50 parts by weight, preferably from 5 to 20 parts by weight, based on 100 parts by weight of the solid content in the curable resin, and have an average particle diameter of from 5 to 50 μm, preferably from 10 to 30 μm.

Usable as the thermoplastic resin used in the present invention are hot-melt resins such as a styrene/butadiene copolymer, terpene phenol resins, acrylic rubbers, epoxy resins, polyvinyl phenols, an acrylonitrile/butadiene copolymer, phenol resins, polyester resins and nylon. In the present invention, these resins can also be used alone or in combinations of two or more kinds. Besides the thermoplastic resins, it is also possible to use thermosetting resins such as epoxy adhesives, thermosetting silicone resins and thermosetting polyimide resins.

Figure 16:
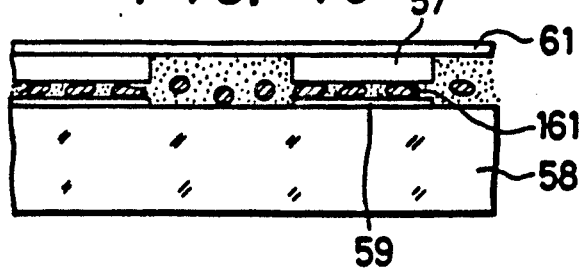
FIG. 16 is a cross sectional view illustrating an embodiment between conductive layers connected according to the method of the present invention.

FIG. 16 is a cross sectional view illustrating the structure at a mutually connected area according to an embodiment of the present invention, where a conductive material pattern 57 of a film carrier and an electrode 59 of a glass substrate 58 are mounted face-to-face, and electrically connected through conductive particles 161 of the anisotropic conductive adhesive. The adhesive of the anisotropic conductive adhesive and the insulating adhesive are filled in the respective spaces in the form of an integral layer, so that the electrical connection can be retained and also the connection areas can be protected from the open air.

As described above, the employment of the anisotropic conductive film formed in the shape of a film by dispersing and mixing the conductive particles in the thermoplastic resin or thermosetting resin makes it possible to suppress the process temperature to a temperature not more than the phase transition temperature of ferroelectric liquid crystals, and thus it has become possible to make connection without causing any orientation disorder during the process of connecting film carrier tapes.

Also, by thermocompression-bonding using the pulse heat tool and by release of a pressure of the tool after the pulse voltage application was stopped and the tool was cooled, the connection resistance has been made stable and the connection reliability has been improved.

Figure 5:
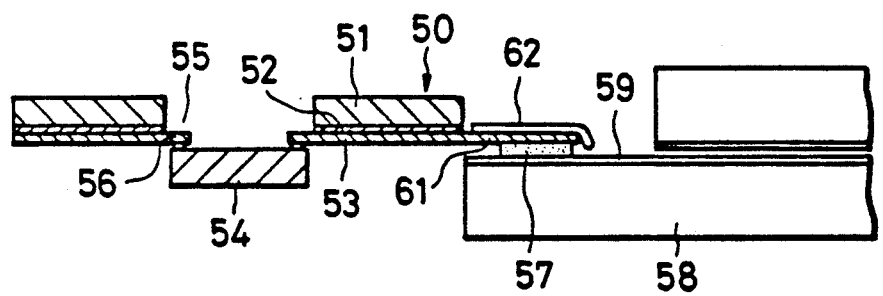
FIG. 5 and FIG. 6 are cross sectional views illustrating packaging structures of film carriers according to the present invention.

FIG. 5 is a cross section illustrating a packaging structure of film carriers according to the present invention, where, for example, copper foil 53 of 35 μm thick is bonded with a bonding material 52 to a flexible insulating film 51 comprising polyimide (as exemplified by Upilex S available from Ube Industries, Ltd.) of 75 to 125 μm thick, and a conductive material pattern is formed thereon by etching.

This conductive pattern is formed in such a manner that it extends up to a device hole 55 to form a finger-shaped inner lead-bonding area 56 used for bonding with a semiconductor device 54, to which the semiconductor device 54 is connected by thermocompression bonding or the like using a gold bump.

Similarly, a finger-like outer lead-bonding area 61 is formed in the manner it extends from the flexible insulating film 51.

The above outer lead-bonding area 61 and a transparent conductive film 59 comprising ITO or the like and being provided on a glass substrate 58 of a liquid crystal display device are disposed facing to each other with the interposition of an anisotropic conductive film 57 (as exemplified by AC5052 available from Hitachi Chemical Co., Ltd.) comprising conductive particles such as metal particles dispersed in an adhesive, and at the same time another flexible insulating film 62 comprising a polyimide (as exemplified by Upilex R; thickness: 7.5 μm; available from Ube Industries, Ltd.) is disposed at an upper part of the outer lead-bonding area 61, and the area 61 and the film 59 are joined by thermocompression bonding through an insulating adhesive, thus forming a film carrier packaging structure. After the thermocompression bonding, the flexible insulating film 62 is removed from the outer lead-bonding area 61.

This flexible insulating film 62 may desirably have its area made substantially same as the dimension of the anisotropic conductive film 57. This flexible insulating film 62 serves to prevent the bonding material for the anisotropic conductive film 57 from being adhered to a head area of a thermocompression bonding hot press at the time of the thermocompression bonding, and also to prevent the anisotropic conductive film from absorbing moisture after the thermocompression bonding and lowering the reliability.

Figure 6:
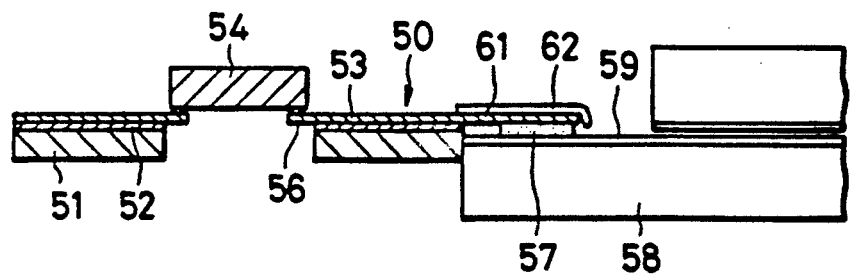

Forming in this manner the packaging structure of film carriers makes it possible to carry out the packaging on the glass substrate 58 in the manner that the front and back surfaces of the whole film carrier 50 are reversed. In FIG. 6, the respective parts correspond to those in FIG. 5.

Figure 7:
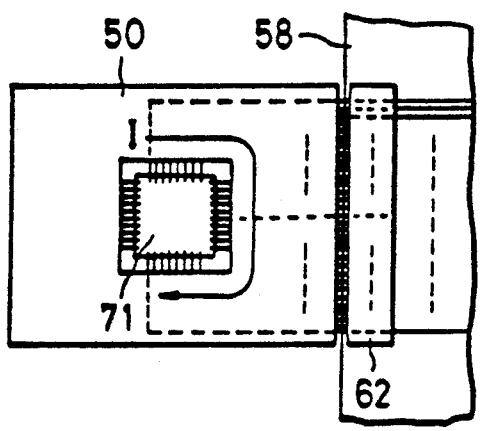
FIG. 7 and FIG. 8 are plan views illustrating output scanning directions of an IC when the film carrier packaging structure according to the present invention is used.
Figure 8:
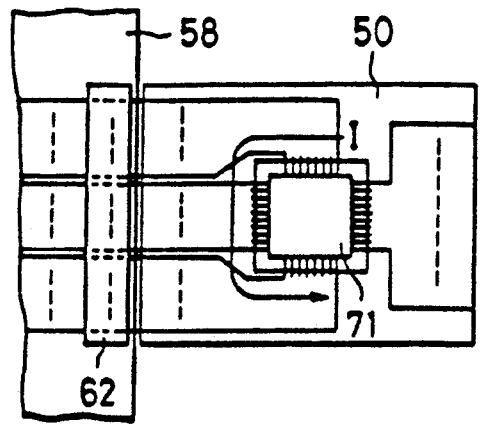
Figure 9:
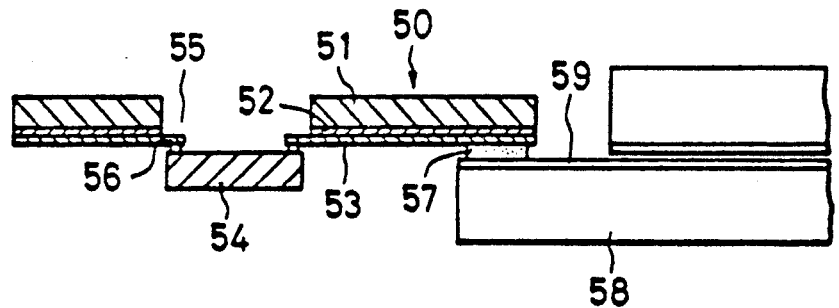
FIG. 9 is a cross sectional view illustrating a prior art film carrier packaging structure employing an anisotropic conductive film.
Figure 10:
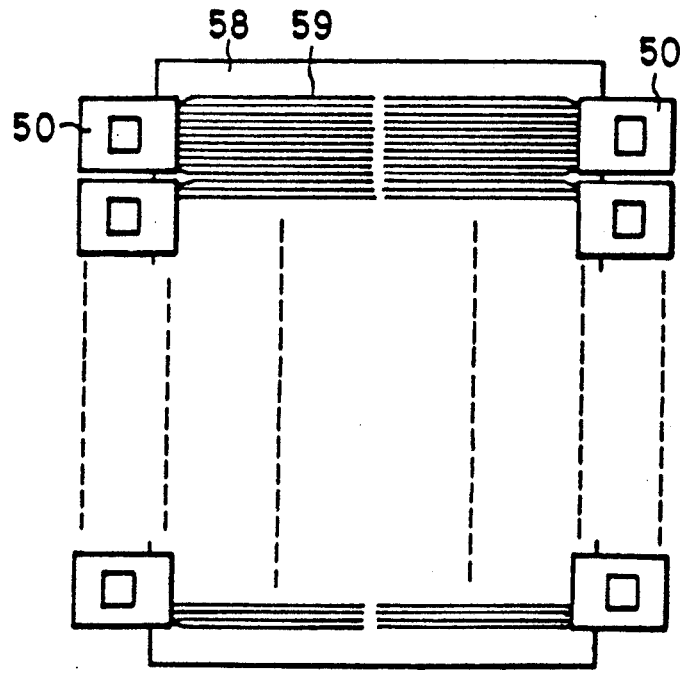
FIG. 10 and FIG. 11 are plan views illustrating how film carriers are packaged on a glass substrate.
Figure 11:
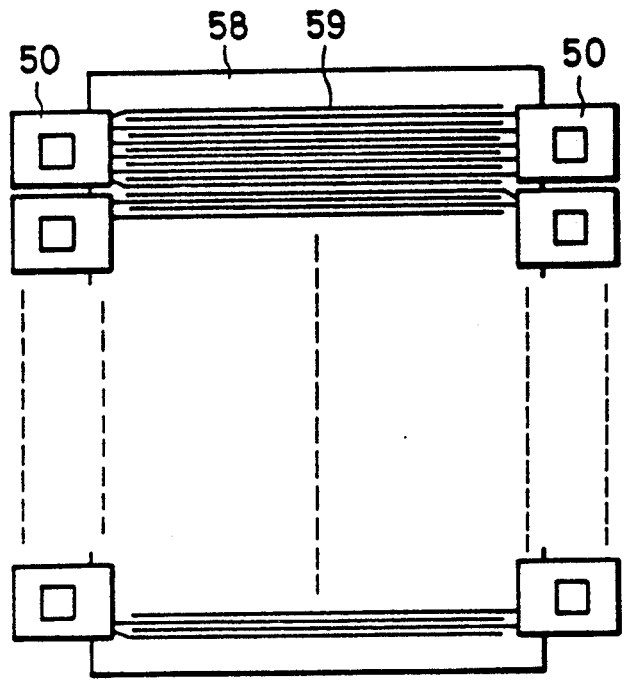
Figure 12:
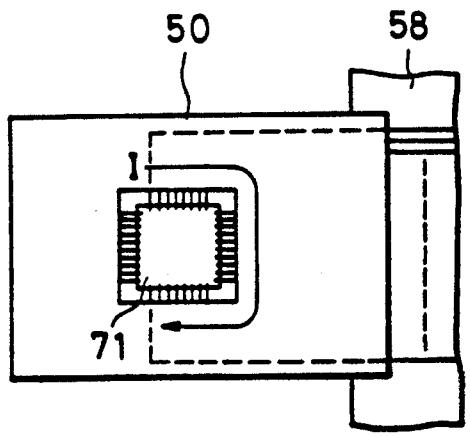
FIG. 12 and FIG. 13 are plan views illustrating output scanning directions of an IC when a conventional film carrier packaging structure is used.
Figure 13:
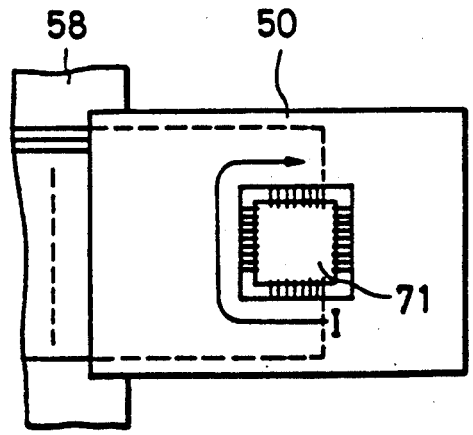

Accordingly, in the film carrier packaging structure of the present invention, in the case that the film carriers 50 are packaged on both sides of the glass substrate 58 as shown in FIG. 10, the film carriers 50 to be packaged on the left side of the glass substrate 58 in FIG. 10 can be packaged in the manner as shown in the cross section of FIG. 5 and the plan view of FIG. 7, and the film carriers 50 to be packaged on the right side can be packaged in the manner as shown in the cross section of FIG. 6 and the plan view of FIG. 8.

Here, in FIG. 7 and FIG. 8, considering the scanning direction of the liquid crystal picture element driving output of the driving IC 71, it is scanned in the direction of an arrow from 1 in a conventional manner in FIG. 7, but in FIG. 8 the film carrier 50 is packaged in the manner that it has been reversed as will be clear from the figure. Accordingly, even if the driving IC 71 and film carrier 50 of the same type are used, the liquid crystal picture element driving output is scanned in the direction of the arrow from 1 as shown in the figures, and the packaging on the right and left of the glass substrate may not result in the change of the scanning direction.

Also, in the film carrier packaging structure of the present invention, the flexible insulating film 62 of the outer lead-bonding area 61 is, as described previously with reference to FIG. 5, bonded to the outer lead-bonding area 61 without using an adhesive, and if there is used a film which is thin enough to allow taking no account of the thermal expansion, it may not occur that the slippage or stress is produced in the anisotropic conductive film.

In the present invention, also used for the thermocompression bonding area is the flexible insulating film 62 which is sufficiently thinner than the flexible insulating film 51 used for the film carrier 50. Accordingly, thermal energy from the heating head of the thermocompression bonding hot press may be readily transmitted to the anisotropic conductive film so that the heating temperature can be controlled relatively with ease and the thermocompression bonding can be carried out in a short time.

In the above examples, a description has been provided on the film carriers and the glass substrate of a liquid crystal display device. However, without limitation to the liquid crystal display device, the present invention can be similarly applied also to the driving-IC packaging in thermal heads for continuous length, close contact type image sensors, EL display devices, etc.

The method in which the thermocompression bonding is carried out with the use of another flexible insulating film sufficiently thinner than the flexible insulating film can also be used not only for the outer lead-bonding area of the film carriers, but also for the bonding of other flexible substrates employing flexible insulating films with glass substrates or printed boards made of glass epoxy phenol or the like.

Figure 14:
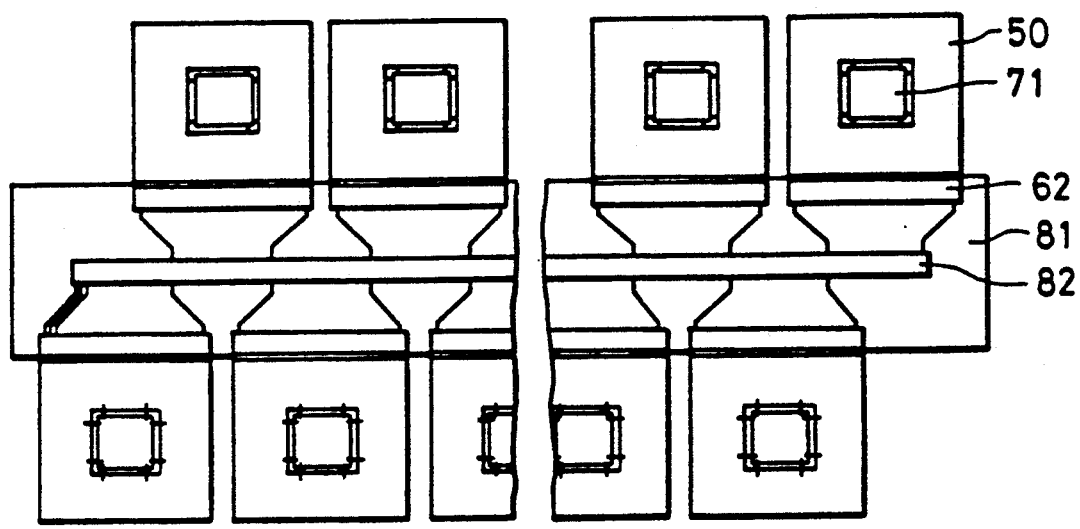
FIG. 14 is a plan view illustrating another embodiment of the present invention.

FIG. 14 illustrates another example in which the present invention is applied to a close contact type image sensor. Also in the case that ICs are packaged by use of a film carrier in conventional direct contact type image sensors, they can only be packaged in a density of about 5 lines/mm (200 μm pitch) if the outer lead-bonding is carried out with use of the anisotropic conductive film, as mentioned in the above example, and therefore it has been impossible to increase the density at sensor areas so much. However, as shown in FIG. 14, the density at sensor areas can be increased by packaging ICs on both sides of a glass substrate, according to the present invention.

In FIG. 14, the numeral 81 denotes a wiring substrate (glass substrate); and 82, a sensor area.

As described above, employment of the film carrier packaging structure according to the present invention makes it possible to package the film carriers in the manner that the front and back surfaces thereof are reversed, by using the semiconductors and film carriers of the same type, so that the packaging can be carried out on the substrate to which they are bonded, without any change of the scanning direction of the output.

Accordingly, the production cost of IC is not increased and a packaging process of the film carrier is not complicated. Since there may occur no slippage or stress to the anisotropic conductive film owing to the difference in thermal expansion coefficient between the flexible insulating film and glass substrate, the present invention facilitates an improvement in the reliability of the connecting sites.

Also since, thermal energy can be readily transmitted from the thermocompression bonding hot press to the anisotropic conductive film at the time of the thermocompression bonding, it follows that the thermocompression bonding temperature can be controlled with ease and the thermocompression bonding can be carried out in a short time.

Figure 15:
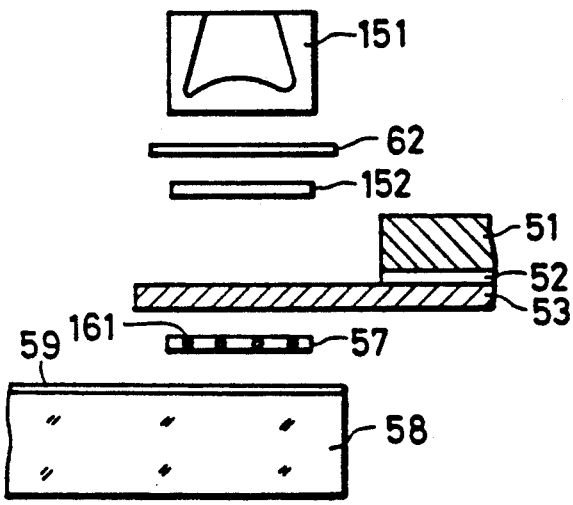
FIG. 15 is a cross sectional view schematically illustrating the method of the present invention.

FIG. 15 is a cross section illustrating an embodiment of the present invention, according to which, between a glass substrate 58 and a film carrier comprising a conductive material pattern (a conductive film) formed in the shape of a finger by removing a base film 51 and an adhesive 52 at an outer lead-bonding area (a conductive material portion not supported by the substrate), an anisotropic conductive adhesive (a film), 57 thinner than the thickness of said conductive pattern 53, is placed. Also an insulating adhesive 152 is placed at an upper part of a film carrier tape, followed by thermocompression bonding by means of a heated heat tool 159 to make the connection.

The flexible insulating film 62 is used for preventing the insulating adhesive 152 from being adhered to the heater tool 151 to stain the surface of the tool.

As to insulating resins used in the anisotropic conductive adhesive 57 and insulating adhesive 152, it is desirable to use those having the same composition, and there can be used hot-melt resins such as a styrene/butadiene copolymer, terpene phenol resins, acrylic rubbers, epoxy resins, polyvinyl phenols, an acrylonitrile/butadiene copolymer, phenol resins, polyester resins and nylon, etc. In the present invention, these resins can also be used alone or in combinations of two or more kinds. In the formation of films, it is also possible to use conventional coating methods as exemplified by roll coating, printing and spray coating, and solvents for coating solutions used in that occasion include toluene, methyl ethyl ketone, ethanol, xylene, etc. which are used alone or as a mixed solvent thereof.

The thickness after being dried, of the insulating adhesive 152 used in the present invention is set to range from 5 μm to 50 μm, preferably from 15 μm to 30 μm, and the thickness after being dried, of the anisotropic conductive adhesive 57, is in the range from 1 to 25 μm, preferably from 5 to 15 μm, approximately. In the laminated structure of this insulating adhesive 152 and anisotropic conductive film 57, it may preferably be set in the range from approximate 10 to 100 μm, preferably from 20 to 50 μm.

A film carrier tape was comprised of a polyimide film (thickness, 125 μm) to which electrolytic copper foil (thickness, 35 μm) adheres, and which is subjected to patterning. At the outer lead-bonding area thereof, it was formed in the form of a finger by removing the polyimide film. The conductive material pattern was polished on its adhering surface and treated with Ni-Au plating to have a thickness of about 30 μm. Here, wiring pitch was set at 100 μm; the conductive material width, at 50 μm; and the conductive material spacing, at 50 μm.

Conductive-material wiring on a glass substrate was made to have a wiring pitch the same as that of the film carrier tape, and formed to have a thickness of 1,500 Å with ITO (ITO: indium-tin oxide).

An anisotropic conductive film 57 used was "AC 5101" (a resin composition comprising a urethane resin and Au-plated resin particles dispersed therein) (film thickness, 8 μm) available from Hitachi Chemical Co., Ltd., and an adhesive using the same resin but containing no conductive particles was formed to have a thickness of 20 μm.

The anisotropic conductive adhesive 57 was placed on the glass substrate, and the pattern of the film carrier was registered, and provisional bonding was effected by pressing for 3 seconds at a temperature of 120° C. and under the pressing condition of 20 kg/cm². Thereafter, an insulating adhesive 152 was placed. Then, with the interposition of a polyimide film (the flexible insulating film 62) of 7.5 μm thick, pressing was carried out for 20 seconds by means of a pulse heat tool 151 at a temperature of 150° C. under the pressing condition of 40 kg/cm², to effect thermocompression bonding.

The bonding area connected by this process had a 90° peel strength of 500 g/cm or more and a connection resistance of 100 ohms or less, obtaining good results, and it was able to be confirmed that the outer-lead connection using the film carrier tape and having a high resolution can be achieved with good reliability.

As described above in detail, the mutual connection having a high resolution and strong bond strength, i.e., having a high reliability was made possible according to the method in which the thin anisotropic conductive adhesive, i.e., an anisotropic conductive adhesive having a high resolution, is placed between the film carrier tape formed in the shape of a finger, having an outer-lead conductive material pattern, and the glass substrate, and the insulating adhesive is placed on the film carrier tape, followed by thermocompression bonding by means of the heat tool to make the connection.

We claim:

1. A film carrier packaging structure comprising:
a plurality of first flexible insulating films having a conductive material pattern formed thereon, with each said conductive material pattern having an outer lead-bonding area and an inner lead-bonding area, with said outer lead-bonding area extending from said first flexible insulating films in the shape of a finger, wherein an inner lead-bonding area of one of said first flexible insulating films connects with a first semiconductor device disposed in a face-up state and an inner lead-bonding area of another one of said first flexible insulating films connects with a second semiconductor device disposed in a face-down state;
a wiring substrate having an anisotropic conductive film disposed thereon, with an outer lead-bonding area of one of said first flexible insulating films being disposed on said conductive film and facing said wiring substrate; and
a second flexible insulating film thinner than said first flexible insulating films and being disposed on said outer lead-bonding area of said one of said first flexible insulating films, wherein said second flexible insulating film is heated to thermocompression-bond said outer lead-bonding area to said wiring substrate.

2. The packaging structure of claim 1, wherein a conductive foil of said outer lead-bonding area has a thickness substantially equal to the sum of the thickness of said second flexible insulating film and the thickness of said anisotropic conductive film.

3. A display apparatus comprising:
a display device including a first display substrate having a first group of electrodes and a first group of terminals connected with said first group of electrodes, a second display substrate having a second group of electrodes intersecting said first group of electrodes and a second group of terminals connected with said second group of electrodes, and a display material disposed between said first and second display substrates;
first and second film carriers comprising first conductive film portions fixed on said carriers and second conductive film portions extending from said carriers;
a first semiconductor element electrically connected with said fixed conductive film portion on said first film carrier in the face-up state, and a second semiconductor element electrically connected with said fixed conductive film portion on said second film carrier in the face-down state; and
a first anisotropic conductive member disposed between said first group of terminals and said conductive film portion extending from said first film carrier, and a second anisotropic conductive member disposed between said second group of terminals and said conductive film portion extending from said second film carrier.

4. A display apparatus of claim 3, further comprising insulating members disposed on said extended conductive material film portions extending from said first and second film carriers.

5. A display apparatus according to claim 3, wherein said display material is a liquid crystal.

6. A display apparatus according to claim 5, wherein said liquid crystal is a ferroelectric liquid crystal.

7. A film carrier packaging structure comprising:
a plurality of first flexible insulating films having a conductive material pattern formed thereon, with each said conductive material pattern having an outer lead-bonding area and an inner lead-bonding area, with said outer lead-bonding area extending from said first flexible insulating films in the shape of a finger, wherein an inner lead-bonding area of one of said first flexible insulating films connects with a first semiconductor device disposed in a face-up state and an inner lead-bonding area of another one of said first flexible insulating films connects with a second semiconductor device disposed in a face-down state; and
a wiring substrate having an anisotropic conductive film disposed thereon, with an outer lead-bonding area of one of said first flexible insulating films being disposed on said conductive film and facing said wiring substrate.

* * * * *

UNITED STATES PATENT AND TRADEMARK OFFICE
CERTIFICATE OF CORRECTION

PATENT NO. : 5,042,919

DATED : August 27, 1991

INVENTOR(S) : Shigeki Yabu, et al.

It is certified that error appears in the above-identified patent and that said Letters Patent is hereby corrected as shown below:

On the Title page, item [56],

U.S. PATENT DOCUMENTS, please insert the following:
        --4,643,536  2/1987   Watanaba et al. ........350/332
        4,474,432  10/1984  Takamatsu et al. .......350/339
        4,295,711  10/1981  Tanaka et al. ..........350/334--;

FOREIGN PATENT DOCUMENTS, please insert the following:
        --2,170,365  7/1986  United Kingdom--.

COLUMN 5:

Line 37, "An," should read --Au,--.

COLUMN 8:

Line 39, "heat tool 159" should read --heat tool 151--.

Signed and Sealed this

Twenty-seventh Day of April, 1993

*Attest:*

MICHAEL K. KIRK

*Attesting Officer*      *Acting Commissioner of Patents and Trademarks*